US009684383B1

(12) United States Patent
Hou et al.

(10) Patent No.: US 9,684,383 B1
(45) Date of Patent: Jun. 20, 2017

(54) ELECTRONIC APPARATUS AND METHOD FOR DETECTING STATUS OF KEYS THEREOF

(71) Applicants: Ching-Min Hou, Taichung (TW); An-Chi Tsai, Taipei (TW); Tzu-I Huang, Hsinchu (TW)

(72) Inventors: Ching-Min Hou, Taichung (TW); An-Chi Tsai, Taipei (TW); Tzu-I Huang, Hsinchu (TW)

(73) Assignee: ITE Tech. Inc., Hsinchu (TW)

( * ) Notice: Subject to any disclaimer, the term of this patent is extended or adjusted under 35 U.S.C. 154(b) by 0 days.

(21) Appl. No.: 15/139,350

(22) Filed: Apr. 27, 2016

(30) Foreign Application Priority Data

Dec. 14, 2015 (TW) .............................. 104141977 A

(51) Int. Cl.
*G06F 3/023* (2006.01)
*H03M 11/20* (2006.01)
(52) U.S. Cl.
CPC ............. *G06F 3/023* (2013.01); *H03M 11/20* (2013.01)
(58) Field of Classification Search
CPC ................................ G06F 3/023; H03M 11/20
See application file for complete search history.

(56) References Cited

U.S. PATENT DOCUMENTS

| 4,709,228 | A | 11/1987 | Hucking et al. |
| 5,448,236 | A | 9/1995 | Shiga |
| 5,638,093 | A | 6/1997 | Takahashi et al. |
| 7,161,505 | B1 | 1/2007 | Falik et al. |
| 2002/0175835 | A1* | 11/2002 | Falik ............... H03M 11/20 341/26 |
| 2006/0049965 | A1* | 3/2006 | Laliberte ............... H03M 11/20 341/24 |
| 2007/0290889 | A1* | 12/2007 | Wiley ............... H03M 11/20 341/22 |
| 2008/0316066 | A1* | 12/2008 | Minato ............... H03M 11/20 341/24 |

(Continued)

FOREIGN PATENT DOCUMENTS

| CN | 203984397 | * 12/2014 |
| WO | 2013063722 | 5/2013 |

OTHER PUBLICATIONS

"Office Action of Taiwan Counterpart Application," issued on Nov. 8, 2016, p. 1-p. 7, in which the listed references were cited.

*Primary Examiner* — Hirdepal Singh
(74) *Attorney, Agent, or Firm* — Jianq Chyun IP Office

(57) ABSTRACT

An electronic apparatus and a method for detecting status of keys thereof are provided. The electronic apparatus comprises a key module, a key control circuit, a conversion circuit with calibration mechanism and a processor. The key control circuit detects whether any of keys in the key module is pressed. If the detection result is affirmative, the press status of each of the keys is scanned by the key control circuit to obtain a coarse scan result. The conversion circuit with calibration mechanism is configured to perform the other system function of the electronic apparatus. When the processor determines that at least one of the keys is not pressed according the coarse scan result, the conversion circuit with calibration mechanism is switched to assist a re-scan operation of the press status of the at least one of the keys.

14 Claims, 7 Drawing Sheets

(56) References Cited

U.S. PATENT DOCUMENTS

| | | | | |
|---|---|---|---|---|
| 2010/0253554 A1* | 10/2010 | Huang | ............... | H03M 11/003 |
| | | | | 341/26 |
| 2014/0316735 A1* | 10/2014 | Jao | ............... | H02H 3/006 |
| | | | | 702/107 |
| 2015/0206672 A1* | 7/2015 | Hsu | ............... | G06F 3/023 |
| | | | | 307/115 |
| 2016/0013806 A1* | 1/2016 | Heldeis | ............... | H03M 11/20 |
| | | | | 341/24 |

* cited by examiner

US 9,684,383 B1

ELECTRONIC APPARATUS AND METHOD FOR DETECTING STATUS OF KEYS THEREOF

CROSS-REFERENCE TO RELATED APPLICATION

This application claims the priority benefit of Taiwan application serial no. 104141977, filed on Dec. 14, 2015. The entirety of the above-mentioned patent application is hereby incorporated by reference herein and made a part of this specification.

BACKGROUND OF THE INVENTION

Field of the Invention

The invention generally relates to an electronic apparatus, and more particularly, to an electronic apparatus having anti-ghosting (N-key rollover) capability and a detection method of status of keys thereof.

Description of Related Art

With reference to FIG. 1, FIG. 1 illustrates a conventional keyboard apparatus 100. The keyboard apparatus 100 may include keys SW1-SW4 and comparators 10, 20. The key SW1 is coupled between a driving line DL1 and a sensing line SL1. The key SW2 is coupled between the driving line DL1 and a sensing line SL2. The key SW3 is coupled between a driving line DL2 and the sensing line SL1. The key SW4 is coupled between the driving line DL2 and the sensing line SL2. The comparator 10 is coupled to the sensing line SL1 to receive a voltage signal SV1 and compares the voltage signal SV1 with a reference voltage Vref. Similarly, the comparator 20 is coupled to the sensing line SL2 to receive a voltage signal SV2 and compares the voltage signal SV2 with the reference voltage Vref.

During a process of detecting a press status of the keys SW1-SW4, the driving line DL1 is driven to a voltage potential and the driving line DL2 is driven to another voltage potential. When the driving line DL1 is driven to the voltage potential, the keys SW1 and SW2 may respectively transmit the corresponding voltage signals SV1, SV2 to the comparators 10, 20 through the sensing lines SL1, SL2 according to the press status of the keys SW1, SW2. Then, the voltage signals SV1, SV2 are respectively compared to the reference voltage Vref by the comparators 10, 20 to determine the press status of the keys SW1, SW2. Similarly, the driving line DL2 is driven to a voltage potential and the driving line DL1 is driven to another voltage potential. When the driving line DL2 is driven to the voltage potential, the keys SW3 and SW4 may respectively transmit the voltage signals SV1, SV2 to the comparators 10, 20 through the sensing lines SL1, SL2 according the press status of the keys SW3 and SW4. Then, the voltage signals SV1, SV2 are respectively compared to the reference voltage Vref by the comparators 10, 20 to determine the press status of the keys SW3 and SW4.

It should be noted that as the number of the keys in the keyboard apparatus increases, the number of the sensing lines would increases, which causes the number of the comparators coupled to the sensing lines for comparing the voltages to increase as well. However, the comparators may have different tolerances due to the drift occurred during the manufacturing fabrication, which may cause misjudgment on the press status of the keys. Therefore, calibrations are performed on each of the comparators to obtain an offset corresponding to each of the comparators, so as to accurately detect the press status of the corresponding keys. Since the process of detecting the status of the keys must store the offset of each of the comparators, such would consume more circuitry resources.

SUMMARY OF THE INVENTION

Accordingly, the disclosure provides an electronic apparatus and a method for detecting the key status of the electronic apparatus. In the disclosure, a conversion circuit having calibration mechanism of the electronic apparatus, which is responsible for other system functions (such as temperature control function or power monitor function, etc.), may be utilized to assist scan operation of the key status of the electronic apparatus. As a result, in addition to the benefit of accurately determine the press status of the keys, the circuit resource of the electronic apparatus is maximized.

The electronic apparatus of the disclosure includes a key module, a key control circuit, a conversion circuit having calibration mechanism, and a processor. The key module includes a plurality of keys, at least one first line and at least one second line, wherein the at least one first line and the at least one second line are coupled to the keys to drive the keys or sense the keys. The key control circuit may be coupled to the at least one first line and the at least one second line. The key control circuit detects whether any one of the keys is pressed, if a detection result is affirmative, the key control circuit scans a press status of each of the keys, and accordingly, obtains a coarse scan result. The conversion circuit having calibration mechanism includes a switch circuit. The switch circuit may be coupled to a first circuit to receive a first sensing signal. The switch circuit may also be coupled to the key control circuit to receive at least one second sensing signal on the at least one second line through the key control circuit, and controlled by a switch signal to pre-select the first sensing signal as an analog signal. The conversion circuit having the calibration mechanism performs a conversion on the analog signal to generate a first result. The processor may be coupled to the key control circuit and the conversion circuit having calibration mechanism. The processor executes a system function corresponding to the first sensing signal according to the first result. When the processor determines that at least one of the keys is not pressed according to the coarse scan result, the processor generates the switch signal to cause the switch circuit to select one of the at least one second sensing signal as the analog signal, so that the conversion circuit having the calibration mechanism performs the conversion on the analog signal to generate a second result, and the processor re-determines the press status of the at least one of the keys according to the second result.

According to one of the exemplary embodiment of the disclosure, in a first scan stage, the key control circuit sequentially selects one of the at least one first line, and parallelly scans the press status of each of the keys on the selected first line through the at least one second line, so as to generate the coarse scan result.

According to one of the exemplary embodiment of the disclosure, in a detection stage, the key control circuit parallelly drives the at least one first line to an identical potential, and parallelly detects whether any one of the keys is pressed as a detection result through the at least one second line. The key control circuit determines whether any one of the keys is pressed according to the detection result in the detection stage, if a determination result is affirmative, the key control circuit enters into the first scan stage.

According to one of the exemplary embodiment of the disclosure, the key control circuit includes at least one comparator circuit and a main control circuit. The at least one comparator circuit may be coupled to the at least one second line and the processor. The main control circuit may be coupled to the at least one first line and the processor. The main control circuit parallelly drives the at least one first line to a first potential in the detection stage. The at least one comparator circuit compares a voltage of the at least one second line with a comparison voltage to generate the detection result. The main control circuit sequentially selects one of the at least one first line in the first scan stage. The main control circuit drives the selected one of the at least one first line to the first potential and drives other of the at least one first line to a second potential. The at least one comparator circuit compares a voltage of the at least one second line with the comparison voltage to generate the coarse scan result.

According to one of the exemplary embodiment of the disclosure, in the first scan stage, when the processor determines that the at least one of the keys is not pressed according to the coarse scan result, the processor enters into a second scan stage and drives the first line corresponding to the key not pressed to a first potential and other of the at least one first line to a second potential through the key control circuit. The processor generates the switch signal to cause the switch circuit to select the second sensing signal of the second line corresponding to the key not pressed as the analog signal, so that the conversion circuit having the calibration mechanism performs the conversion to the analog signal to generate the second result. The processor compares the second result and a threshold value to re-determine the press status of the key not pressed.

According to one of the exemplary embodiment of the disclosure, the conversion circuit having the calibration mechanism further includes an analog-to-digital converter. The analog-to-digital converter may be coupled to the switch circuit to receive the analog signal and perform an analog-to-digital conversion to the analog signal to generate the first result or the second result, wherein the analog-to-digital converter has calibration mechanism.

According to one of the exemplary embodiment of the disclosure, the first circuit comprises a temperature sensor or a power measurement circuit, and the processor executes a temperature control function or a power monitor function of the system function according to the first result.

In the disclosure, the method for detecting the key status may be adapted to a key module of an electronic apparatus. The method for detecting the key status includes the following steps. In a detection stage, whether any one of a plurality of keys in the key module is pressed may be detected by a key control circuit of the electronic apparatus. If a detection result is affirmative, the process enters into a first scan stage. In the first scan stage, a press status of each of the keys may be detected by the key control circuit, and accordingly, a coarse scan result is obtained. In the first scan stage, whether at least one of the keys is not pressed is determined according to the coarse scan result by a processor of the electronic apparatus. If a determination result indicates that at least one of the keys is not pressed, the process enters into a second scan stage. In the second scan stage, a switch signal is generated by the processor, which causes a switch circuit in a conversion circuit having calibration mechanism to be switched to select one of at least one second sensing signal from the key module as an analog signal for performing a conversion to the analog signal by the conversion circuit having calibration mechanism, so as to generate a second result. In the second scan stage, the press status of the at least one of the keys is re-determined according to the second result. After the re-determination of the press status of the at least one of the keys is completed, the switch signal is generated by the processor, so as to cause the switch circuit to be switched back to select a first sensing signal from a first circuit as the analog signal for performing the conversion to the analog signal to generate a first result by the conversion circuit having calibration mechanism. A system function corresponding to the first sensing signal may be executed according to the first result by the processor.

Based on the above, in the electronic apparatus and the method for detecting the key status of the electronic apparatus, the conversion circuit having calibration mechanism, which is utilized for other system functions (such as temperature control function or power monitor function), may be dynamically switched to assist in a scan function of the key module. Since a first sensing signal which the conversion circuit having calibration mechanism is to convert originally would not have instantaneous enormous changes, the conversion circuit having calibration mechanism may be dynamically and temporarily switched to assist the scan function of the key module without affect the original system function. As a result, the key control circuit would not need calibration mechanism which reduces the cost of the circuit. In addition, since the conversion circuit having calibration mechanism is only utilized to assist the re-scan of the key that is determined to be not pressed, time and the number of times of the re-scan may be reduced. Therefore, in addition to the accurate determination of the press status of the keys, the electronic apparatus of the disclosure also maximizes the usage of the circuit resources.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
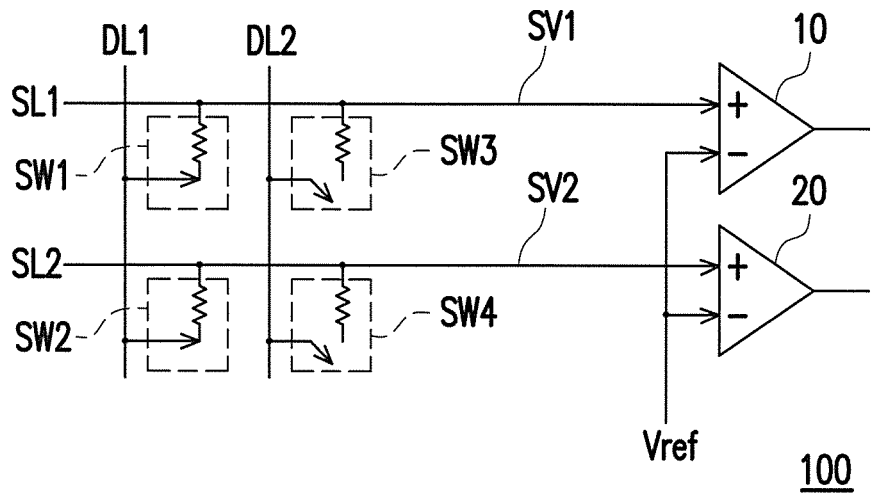
FIG. 1 illustrates a conventional keyboard apparatus 100.

Reference will now be made in detail to the present preferred embodiments of the invention, examples of which are illustrated in the accompanying drawings. Wherever possible, the same reference numbers are used in the drawings and the description to refer to the same or like parts.

Figure 2:
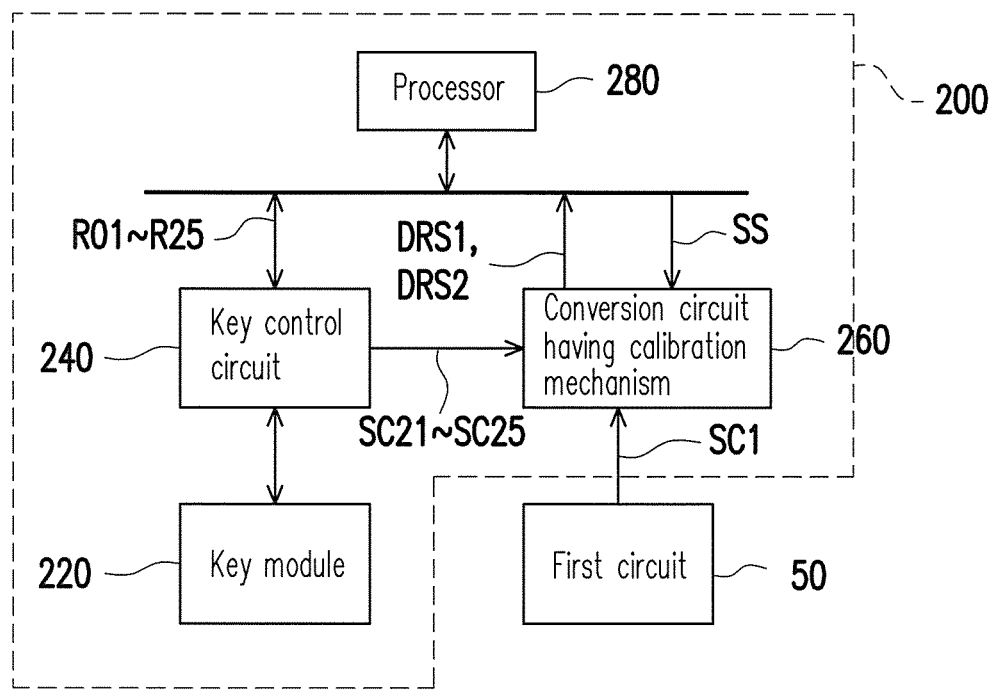
FIG. 2 is a schematic diagram illustrating an electronic apparatus 200 according to an exemplary embodiment of the disclosure.

With reference to FIG. 2, FIG. 2 is a schematic diagram illustrating an electronic apparatus 200 according to an exemplary embodiment of the disclosure. The electronic apparatus 200 may include a keyboard module 220, a key control circuit 240, a conversion circuit having a calibration mechanism 260 and a processor 280. However, the disclosure is not limited to the above parts.

Figure 3:
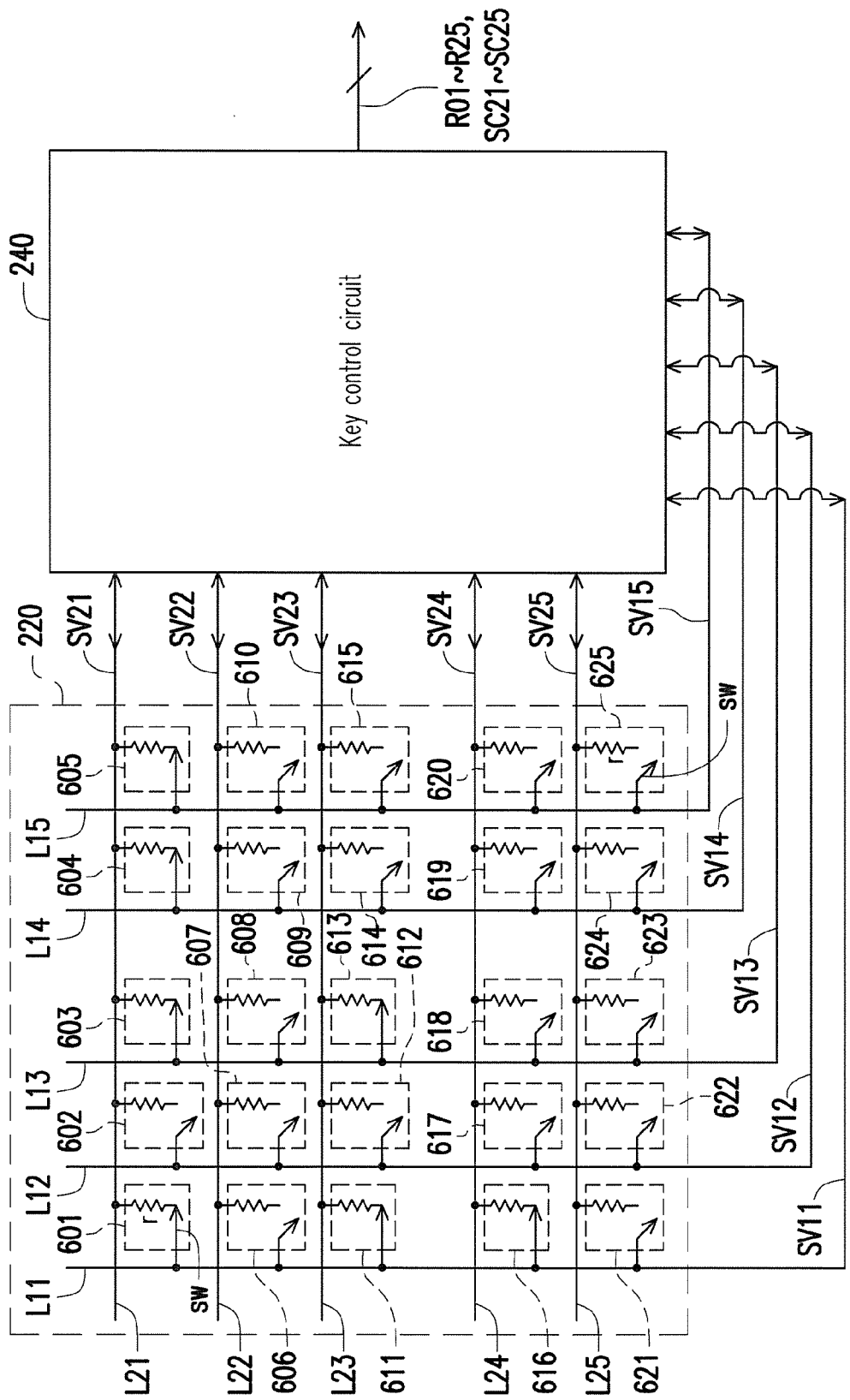
FIG. 3 is a schematic diagram illustrating the keyboard module 220 and the key control circuit 240 illustrated in FIG. 2.

With reference to FIGS. 2 and 3, FIG. 3 is a schematic diagram illustrating the keyboard module 220 and the key control circuit 240 illustrated in FIG. 2. The keyboard module 220 may include M×N keys, N first lines, and M second lines, wherein M is a positive integer greater than or equal to 1, and N is a positive integer greater than and equal to 1. In order to make the disclosure comprehensive, M and N are hypothetically presumed as 5, for example. However, the disclosure is not limited thereto, M and N may be any other values, and exemplary embodiments having other values for M and N may be deduced from the description set forth below. Therefore, the keyboard module 220 illustrated in FIG. 3 may includes twenty-five keys 601-625, five first lines L11-L15, and five second lines L21-L25, where keys 601, 603-605, 611, 613 and 616 are being pressed. Each of the keys 601-625 includes a resistor r and a switch sw, where the resistor r and the switch sw are serially connected to each other, and the switch sw of the key (e.g., key 601) may closed (conduct) in response the key (key 601) being pressed, and the switch sw may be opened (not conduct) in response to the key (key 625) not being pressed.

The first lines L11-L15 and the second lines L21-L25 may be coupled to the keys 601-625 to drive the keys 601-625 or to sense the keys 601-625. In detail, the first line L11 is coupled to the keys 601, 606, 611, 616, 621 to drive or sense the keys 601, 606, 611, 616, 621. The rest of the first lines L12-L15 may be deduced according to the content illustrated in FIG. 3. The second line L21 is coupled to the keys 601-605 to drive or sense the keys 601-605. The rest of the second lines L22-L25 may be deduced according to the content illustrated in FIG. 3. In other words, the first lines L11-L15 may be utilized as driving lines as well as sensing lines, which may be configured based on the stage of the operation or process of the key control circuit 240. Similarly, the second lines L21-L25 may be configured as driving lines as well as sensing lines, which may be configured based on the stage of the operation or process of the key control circuit 240. Detail of which would be described later. The key control circuit 240 is coupled to the first lines L11-L15 and the second lines L21-25. The key control circuit 240 may detect whether any key among the keys 601-625 is pressed. If a detection result is affirmative, the key control circuit 240 may further scan a press status for each of the keys 601-625 to obtain a coarse scan result R01-R25 (as illustrated in FIG. 2.)

The conversion circuit having calibration mechanism 260 (as illustrated in FIG. 2) may be coupled to a first circuit 50 to receive a first sensing signal SC1. The conversion circuit having the calibration mechanism 260 may be further coupled to the key control circuit 240 to receive a plurality of second sensing signals SC21-SC25 from the second lines L21-L25 through the key control circuit 240. Furthermore, the conversion circuit having calibration mechanism 260 may be controlled by a switch signal SS to pre-select the first sensing signal SC1 to perform a conversion, so as to generate a first result DRS1.

The processor 280 may be coupled to the key control circuit 240 and the conversion circuit having calibration mechanism 260. The processor 280 may execute a system function corresponding to the first sensing signal SC1 according to the first result DRS1. For example, in one of the exemplary embodiments of the disclosure, the first circuit 50 may include a temperature sensor (e.g., thermistor) or a power measurement circuit (e.g., coulomb meter.) The first circuit 50 may be utilized to measure the temperature or the battery capacity of the electronic apparatus 200 to generate a first sensing signal SC1, however, the disclosure is not limited thereto. The conversion circuit having calibration mechanism 260 may pre-select the first sensing signal SC1 to perform the conversion, so as to generate the first result DRS1. The processor 280 may execute a temperature control function or a power monitor function among the system function of the electronic apparatus 200 according to the first result DRS1. In addition, the first circuit 50 may be external to the electronic apparatus 200, or internal to the electronic apparatus 200, which may be designed based on the practical application.

On the other hands, since the key control circuit 240 does not have calibration mechanism, the coarse scan result R01-R25 obtained by scanning the press status of each of the keys 601-625 may not be completely accurate. In detail, as the number of the pressed keys among the keys 601-625 increases, the key control circuit 240 may misjudge some keys among the keys 601-625 that are indeed being pressed as keys that are not being pressed. Therefore, in one of the exemplary embodiment, when the processor 280 determines that at least one key among the keys 601-625 are not being pressed according the coarse scan result R01-R25, the processor 280 may generate a switch signal SS to switch the conversion circuit having the calibration mechanism 260, so that corresponding one of the second sensing signal among the second sensing signals SC21-SC25 is selected for the conversion, and accordingly generate a second result DRS2. The processor 280 may re-determine the press status of the at least one key among the keys 601-625 according to the second result DRS2.

After the processor 280 re-determined the press status of the at least one key among the keys 601-625, the processor 280 may generate the switch signal SS, so that the conversion circuit having calibration mechanism 260 may be switched back to select the first sensing signal SC1 to perform its original system function, such as the temperature control function, the power monitor function, etc. which are system functions that does not have instantaneous enormous changes. Since the temperature or the power of the electronic apparatus 200 would not be have enormous changes instantly, the conversion circuit having the calibration mechanism 260 may be dynamically and temporarily switched to assist the scan function of the press status of the keys 601-625 without affecting the original system function. As such, the key control circuit 240 does not have to perform calibration. In addition, since the conversion circuit having calibration mechanism 260 is utilized to assist the re-scan (i.e., fine scan) to the keys being determined as not pressed, time and the number of times of the re-scans may be reduced. Therefore, in addition to accurately determine the press status of the keys 601-625, the circuit resources of the electronic apparatus 200 are also maximized.

In one of the exemplary embodiment of the disclosure, the key control circuit 240 may be operated in a detection stage, a first scan stage, or a second scan stage, however, the disclosure is not limited thereto. In the detection stage, the key control circuit 240 may detect whether any key among the keys 601-625 of the keyboard module 220 is pressed. If the key control circuit 240 determines that none of the keys 601-625 is pressed, the key control circuit 240 may continue to operate in the detection stage, so as to perform detection. On the contrary, if the key control circuit 240 detects any key among the keys 601-625 is pressed, regardless one or more keys among keys 601-625 are pressed, the key control circuit 240 then enters into the first scan stage. In the first scan stage, the key control circuit 240 may scan each key among the keys 601-625 and compare voltages on each of the sensing lines (e.g., the second lines L221-L25) to a comparison voltage, so as to determine the press status of each key among the keys 601-625.

Figure 4:
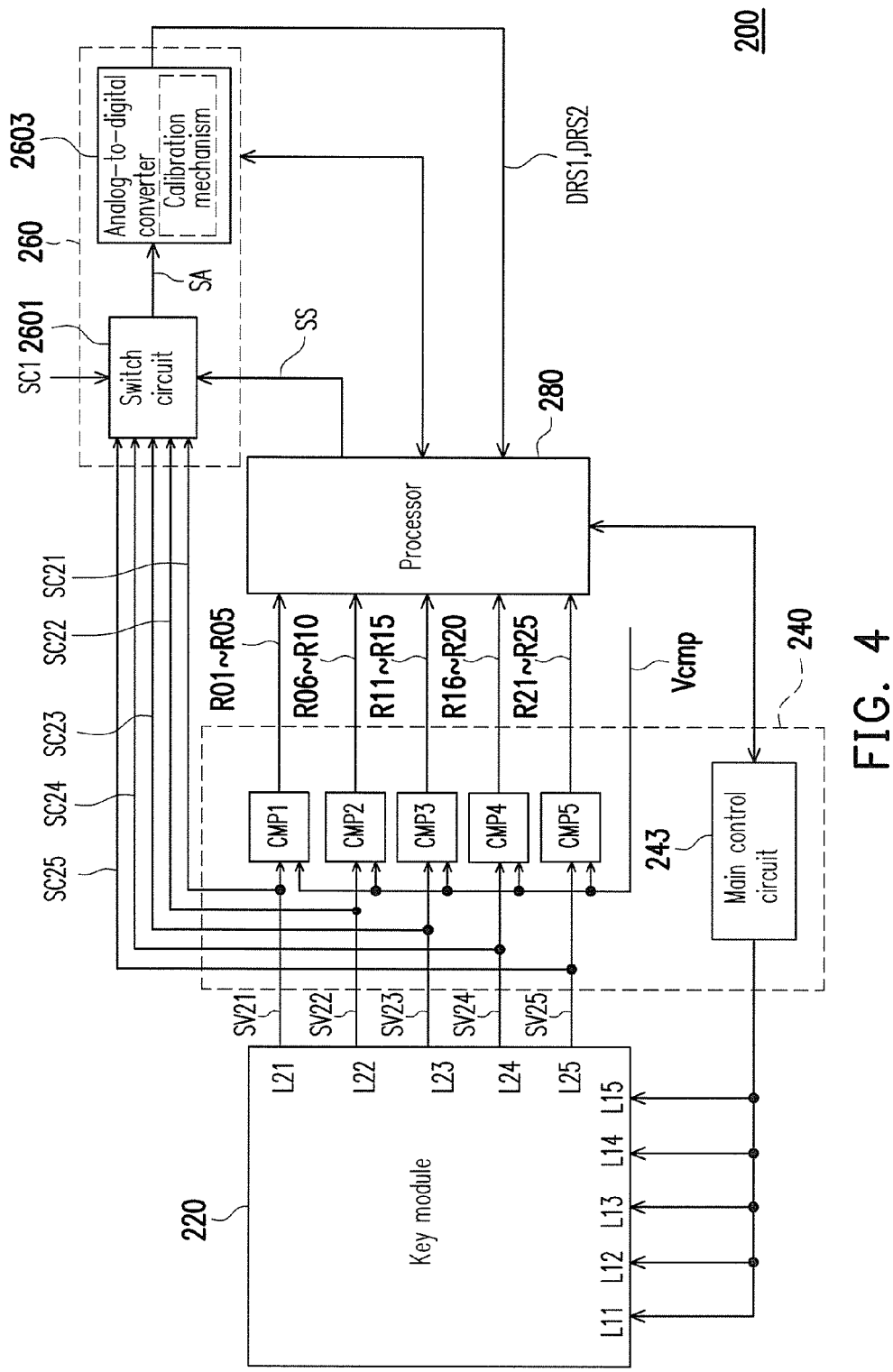
FIG. 4 is a circuit block diagram of the electronic apparatus 200 illustrated in FIG. 2.

With reference to FIGS. 2-4, FIG. 4 is a circuit block diagram of the electronic apparatus 200 illustrated in FIG. 2. The keyboard module 220 of FIG. 4 is similar to the keyboard module 220 illustrated in FIG. 3. As illustrated in FIG. 4, the key control circuit 240 may include comparator circuits CMP1-CMP5 and a main control circuit 243, however, the disclosure is not limited thereto. The comparator circuits CMP1-CMP5 may be respectively coupled to the second lines L21-L25 and the processor 280, wherein the comparator circuits CMP1-CMP5 may not have calibration mechanism. The main control circuit 243 may be coupled to the first lines L11-L15 and the processor 280. In the exemplary embodiment illustrated in FIG. 4, the first lines L11-L15 may be utilized as driving lines, and the second lines L21-L25 may be utilized as sensing lines.

The conversion circuit having calibration mechanism 260 may include a switching circuit 2601 and an analog-to-digital converter (ADC) 2603. The switching circuit 2601 may be utilized to receive a first sensing signal SC1 and a plurality of second signals SC21-SC25 corresponding to the second lines L21-L25. The switch circuit 2601 may be controlled by the switch signal SS to select one of the first sensing signal SC1 and the second sensing signals SC21-SC25 as an analog signal SA. The analog-to-digital converter 2603 may be coupled to the switching circuit 2601 to receive the analog signal SA. The analog-to-digital converter 2603 may perform an analog-to-digital conversion to the analog signal SA to generate the first result DRS1 or the second result DRS2, wherein the analog-to-digital converter 2603 has the calibration mechanism and a calibration value of the analog-to-digital converter 2603 may be provided by the processor 280. In one of the exemplary embodiment of the disclosure, the analog-to-digital converter 2603 may be implemented by a successive approximation register ADC (SAR ADC), counting ADC, parallel-comparator ADC, or Dual-slope or Radiometric ADC. However, the disclosure is not limited thereto, the type of the analog-to-digital convertor 2603 may be selected based on the practical application or design requirements.

In one of the exemplary embodiments of the disclosure, the processor 280 may be implemented as hardware, firmware, or executable program code stored in a memory which may be loaded and executed by a micro processor or a digital signal processor (DSP). In the implementation of hardware, the processor 280 may be a plurality of circuits or an integrated circuit. However, the disclosure is not limited thereto. The plurality of circuits or the integrated circuit may be implemented by Application-Specific Integrated Circuit (ASIC) or Field Programmable Gate Array (FPGA). The memory may be compact disc, random access memory (RAM), read only memory (ROM), flash memory, floppy disc, hard drive, or Magneto-optical disc, etc.

Figure 5:
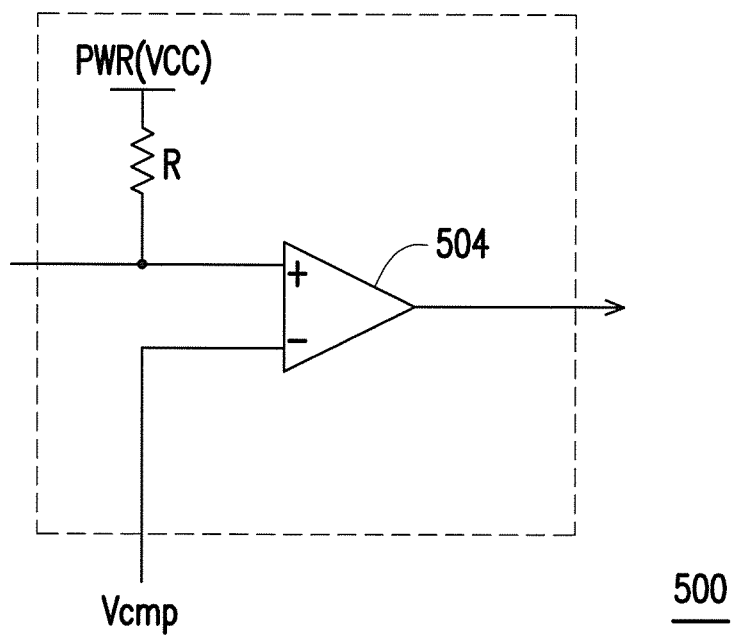
FIG. 5 is a diagram illustrating a circuit structure of a comparator circuit illustrated in FIG. 4.

Specifically, the circuit structure of each of the comparator circuits CMP1-CMP5 may be the circuit structure illustrated in FIG. 5, however, the invention is not limited thereto. FIG. 5 illustrates a comparator circuit 500, where the comparator circuit 500 includes a comparator 504 and a resistor R. A non-inverting input of the comparator 504 is coupled to an input terminal of the comparator circuit 500, an inverting input of the comparator 504 may receive a comparison voltage Vcmp, and an output of the comparator 504 is coupled to the output terminal of the comparator circuit 500. The resistor R is coupled between the non-inverting input of the comparator 504 and a power terminal PWR. The power terminal PWR is, for example, an operation power terminal of the key control circuit 240, and the voltage potential of the power terminal PWR is, for example, a second potential VCC, however, the disclosure is not limited thereto. The voltage value of the comparison voltage Vcmp may be between 0V and the second potential VCC.

With reference to FIGS. 2-5, in the detection stage, the key control circuit 240 may parallelly drive the first lines L11-L15 to an identical potential, and parallelly detect whether the keys are pressed as the detection results through the second lines L21-L25. In detail, a main control circuit 243 may parallelly drive the first line L11-L15 to the first potential (e.g., 0 volt, but not limited thereto). The comparator circuits CMP1-CMP5 may respectively compare voltages SV21-SV25 on the second lines L21-L25 with the comparison voltage Vcmp, so as to generate the detection results.

For example, assuming that a resistance of the resistor R of the comparator circuit 500 is greater than a resistance of the resistors r in the keys 601-625. If any of the keys (e.g., keys 601, 603-605) is pressed, which causes the voltage SV21 on the second line L21 to be the first potential (e.g., 0 Volt), the comparison operation of the comparator circuit CMP1 may obtain, for example, logic 0 as the detection result. On the contrary, if no keys among the keys 606-610 is pressed, which causes the voltage SV22 on the second line L22 to be the second potential VCC, the comparison operation of the comparator circuit CMP2 may obtain for example, logic 1 as the detection result. The logic 0 and logic 1 described above are for illustration, and it is intended to limit the disclosure. The detection result of other second lines L23-L25 may be deduced from the exampled above, and thus is not being repeated.

In one of the exemplary embodiments of the disclosure, the key control circuit 240 may detect whether any one of the keys 601-625 is pressed according to the detection result in the detection stage. If the detection result is affirmative, the key control circuit 240 would then enter the first scan stage. In the first scan stage, the key control circuit 240 may sequentially select one of the five first lines L11-L15 (e.g., the first line L11), and then parallelly scans the press status of five keys (e.g., keys 601, 606, 611, 616, 621) corresponding to the selected first line (e.g., first line L11) through the five second lines L21-L25, so as to generate a coarse scan result (e.g., coarse scan result R01, R06, R11, R16, R21) corresponding to the first line (e.g., L11).

For example, in the first scan stage, the key control circuit 240 may first select, but not limited to, the first line L11 and scan the press status of the five keys 601, 606, 611, 616, 621 of the first line L11 through the five second lines L21-L25, so as to generate the coarse scan results R01, R06, R11, R16, R21 corresponding to the first line L11. Next, the controller 240 may select the first line L12 and scan the press status of five keys 602, 607, 612, 617, 622 of the first line L12 through the five second lines L21-L25, so as to obtain the coarse scan results R02, R07, R12, R17, R22 corresponding to the first line L12. The rest of the first lines (e.g., L13-L15) may be deduced from the above example, thus it is not being repeated here.

In detail, in the first scan stage, the main control circuit 243 may select the first line L11 among the five first lines L11-L15. The main control circuit 243 may drive the first line L11 to the first potential (e.g., 0V) and other first lines L12-L15 to the second potential VCC. The comparator circuits CMP1-CMP5 may respectively compares the voltages SV21-SV25 of the second lines L21-L25 with the comparison voltage Vcmp, so as to generate the coarse scan results R01, R06, R11, R16, R21 corresponding to the first line L11. As a result, the processor 280 may obtain the press status corresponding to each of the keys 601, 606, 611, 616, 621 on the first line L11. Similarly, other first lines L12-L15 may be deduced from the above example.

It should be noted that the coarse scan result R01-R25 obtained in the first scan stage may be misjudgment. In detail, in the first scan stage, as the number of the keys being pressed among the keys 601-605 on the second line (e.g., sensing line) L21 increases, the potential of the voltage SV21 on the second line L21 would be closer to the second potential VCC, which may cause the keys 601-605 on the second line L21 to be misjudged as not being pressed. With similar rationale, other second lines L22-L25 may have similar scenario.

Figure 6A:
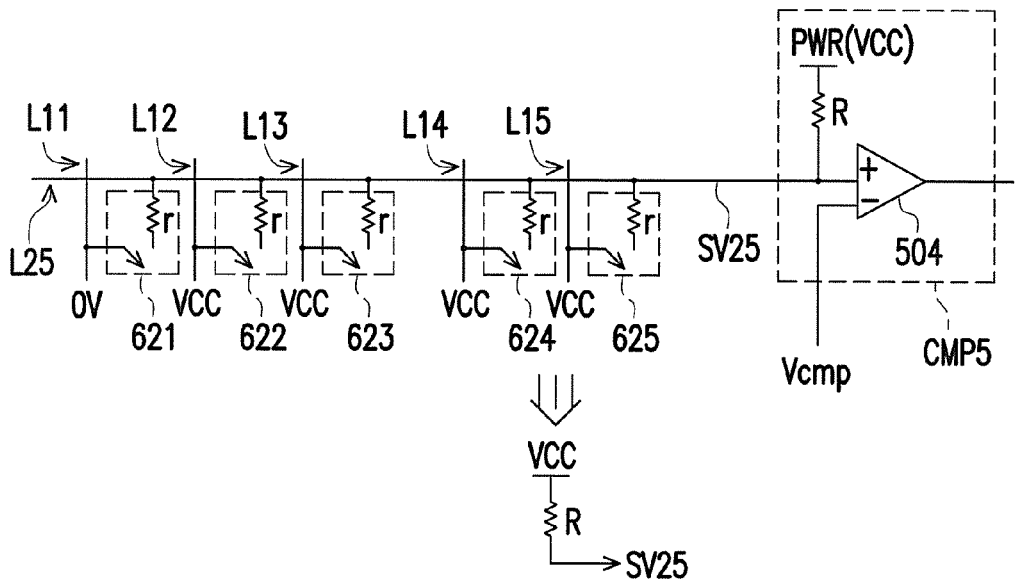
FIGS. 6A-6C are circuit diagrams illustrating a voltage dividing circuit formed by keys of second lines and the comparator circuits according to one of the exemplary embodiments of the disclosure.

For example, with reference to FIG. 6A, FIG. 6A is a schematic diagram illustrating a voltage dividing circuit formed by the keys 621-625 of the second line L25 and the comparator circuit CMP5. Herein, it is assumed that the first potential is 0V, the resistance of the resistor r of each of the keys 621-625 in FIG. 6A is much smaller as compared to the resistance of the resistor R of the comparator circuit CMP5. In the first scan stage, it is assumed that the first line (driving line) L11 is selected, where the first line (driving line) L11 is driven to 0V (i.e., the first potential), and other first lines (driving lines) L12-L15 are driven to the second potential VCC. Since no keys on the second line L25 are being pressed, the potential of the voltage SV25 on the second line (sensing line) L25 equals to the second potential VCC.

Figure 6B:
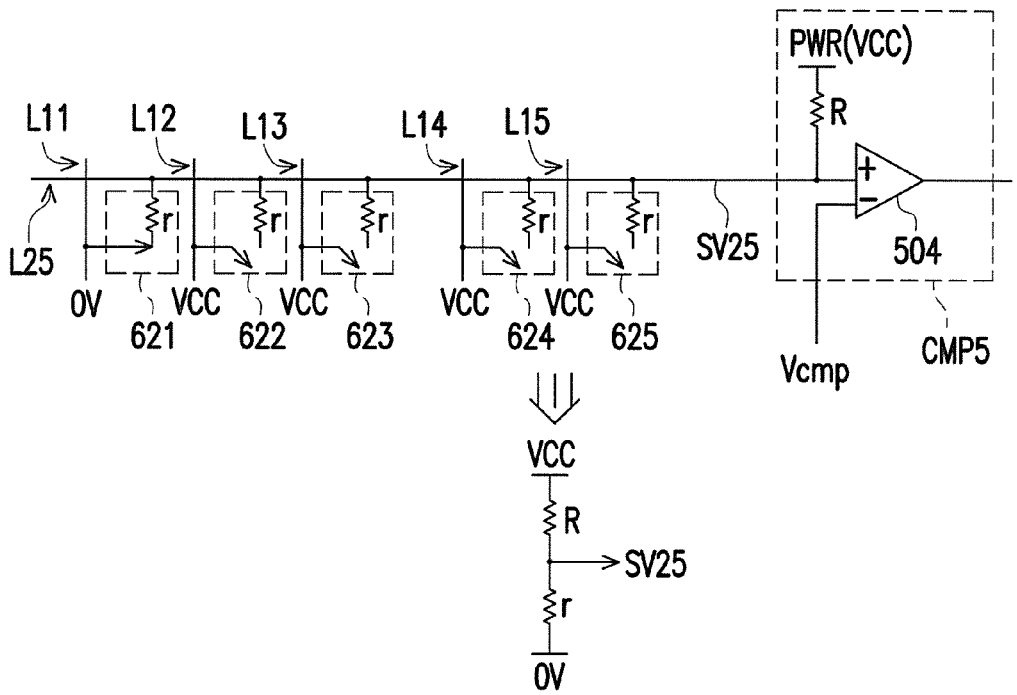

With reference to FIG. 6B, FIG. 6B is a schematic diagram illustrating another voltage dividing circuit formed by the keys 621-625 on the second line L25 and the comparator circuit CMP5. As illustrated in FIG. 6B, since the key 621 on the selected first line (driving line) L11 is being pressed, and the keys 622-625 are not being pressed, the potential of the voltage SV25 on the second line (sensing line) L25, which corresponds to the key 621, is (VCC×(r÷(r+R)). Since the resistance of the resistor r is much smaller than the resistance of the resistor R, the potential of the voltage SV25 would be close to 0V (i.e., first potential). Therefore, the comparator circuit CMP5 may easily determine that the key 621 is pressed.

Figure 6C:
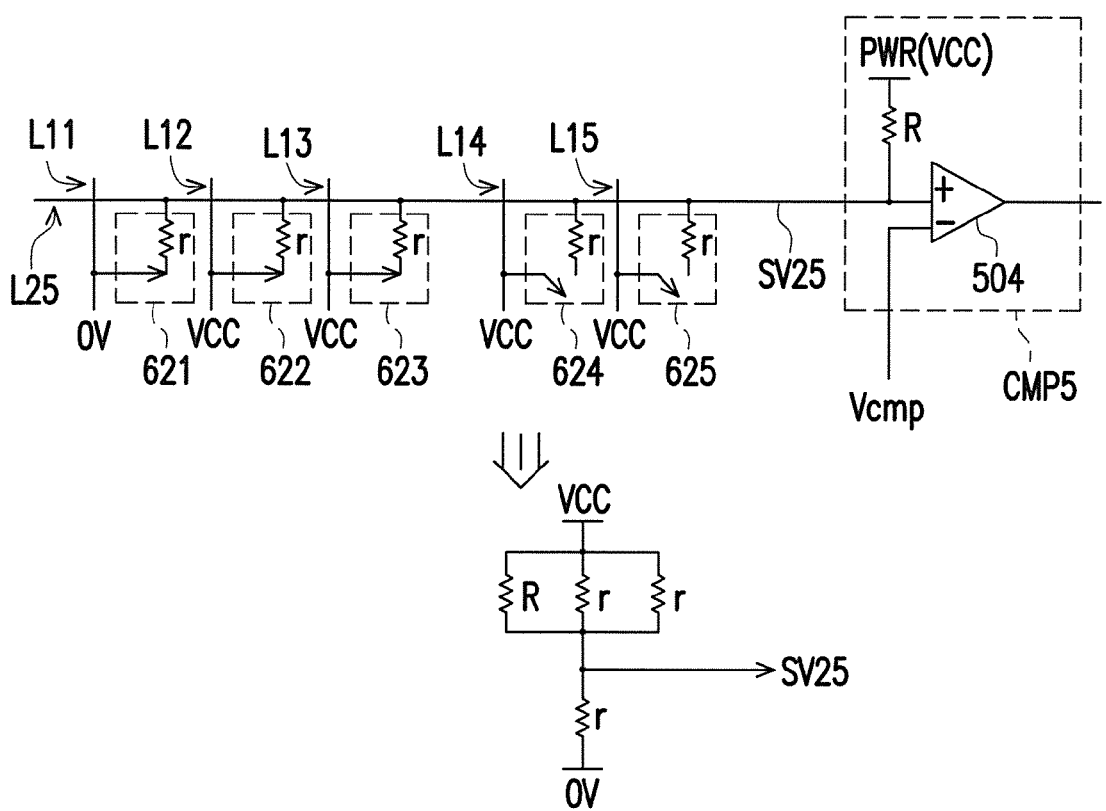

With reference to FIG. 6C, FIG. 6C is a schematic diagram illustrating yet another voltage dividing circuit formed by the keys 621-625 on the second line L25 and the comparator circuit CMP5. When i keys (e.g., 3 keys, including key 621) on the selected first line (driving line) L11 are pressed, the potential of the voltage SV25 on the second line (sensing line) L25 is VCC×r/{[R∥(r/(i−1)]+r}=VCC×{1−1/[i+(r/R)]}, wherein i is a positive number greater than 1 but smaller than and equal to 5. As the variable i increases, the potential of the voltage SV25 would be closer to the second potential VCC, which may cause the key 621 to be misjudged as not being pressed by the key control circuit 240 having no calibration mechanism. As a result, it is difficult to determine (or unable to identify) whether the key 621 corresponding to the first line (driving line) L11 and the second line (sensing line) L25 is being pressed or not. It should be noted that the misjudgment of the key control circuit 240 having no calibration mechanism would only occur when keys on the second line (sensing line) L25 are misjudged as not being pressed while a plurality of keys are being pressed. In other words, the keys indicated as not being pressed by the coarse scan result R01-R25 (as illustrated in FIG. 2) must be re-determined through the conversion circuit having the calibration mechanism 260 (as illustrated in FIG. 2).

With reference to FIGS. 2-4, for example, in the first scan stage, if the processor 280 determines that keys 601, 603-605, 614-615, 618-620 are not being pressed according to the coarse scan result R01-R25, the press status of the keys 601, 603-605, 614-615, 618-620 must be re-determine by the conversion circuit having the calibration mechanism 260. Therefore, the processor 280 may enter the second scan stage, drive the first line L11 corresponding to the key 601 to the first potential (e.g., 0V) through the key control circuit 240, and drive other first lines L12-L15 to the second potential VCC. The processor 280 generates the switch signal SS to cause the conversion circuit having the calibration mechanism 260 to select a second sensing signal SC1 of the second line L21 corresponding to the key 601 for conversion, so as to generate the second result DRS2. The processor 280 may compare the second result DRS2 to a threshold value, so as to re-determine the press status of the key 601. Similarly, a re-determination of the press status of the keys 603-605, 614-615, 618-620 may be deduced based on the above illustration.

Since the analog-to-digital converter 2603 has calibration mechanism, the second result DRS2 generated by the analog-to-digital converter 2603 would be a result after the calibration, and the accuracy of the second result DRS2 would not be affected by the drift of the manufacturing fabrication.

Figure 7:
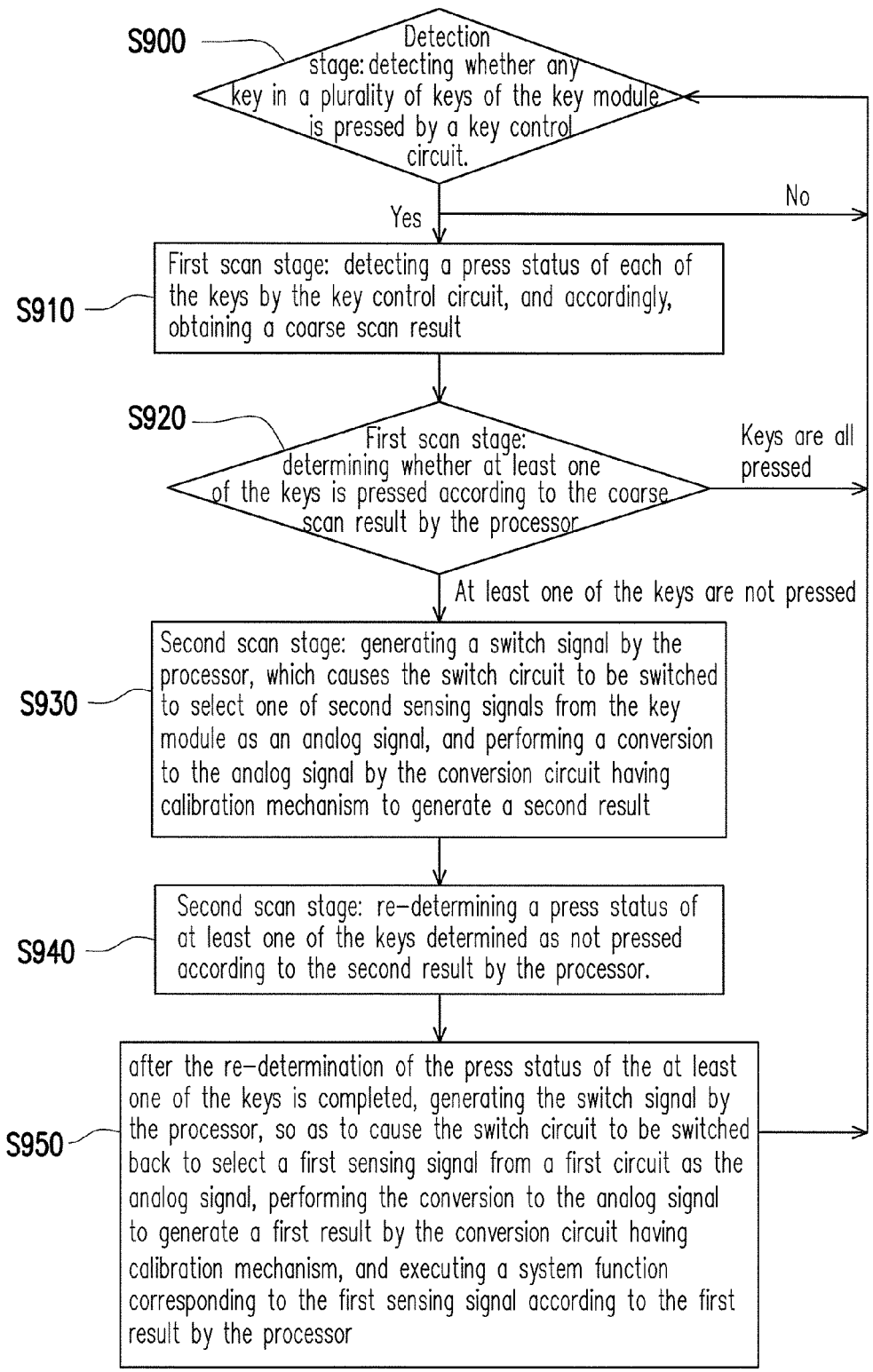
FIG. 7 is a flow diagram illustrating the detection method of detecting the status of the keys of the electronic apparatus according to one of the exemplary embodiment of the disclosure.

FIG. 7 is a flow diagram illustrating the detection method of detecting the status of the keys of the electronic apparatus according to one of the exemplary embodiment of the disclosure. With reference to FIGS. 2-4 and 7, the detection method of the status of the key of the exemplary electronic apparatus includes the following steps. First of all, in the detection stage illustrated in step S900, whether any of the keys among keys 601-625 of the key module 220 is pressed may be detected by the key control circuit 240. If the detection result is affirmative, the process would enter into a first scan stage illustrated in S910, otherwise, the process would continue to perform the detection operation of the detection stage of step S900. Next, in the first scan stage illustrated in step S910, the press status of each of the keys 601-625 is being detected through the key control circuit 240, and accordingly, the coarse scan result R01-R25 is obtained. Afterward, in the first scan stage illustrated in step S920, whether at least one key of the keys 601-625 is not pressed may be determined by the processor 280 according to the coarse scan result R01-R25. If the determination result shows that the keys 601-625 are all being pressed, the scan of the keys 601-625 is complete, and the process is return back to the detection stage illustrated in step S900 for the next detection operation. If the determination result shows that at least one key among the keys 601-625 are not pressed, the process goes into a second scan stage illustrated in step S930 to perform a fine scan. In the second scan stage illustrated in step S930, a switch signal SS may be generated by the processor 280, so as to switch the switch circuit 2601 to select one of the second sensing signals SC21-SC25 from the key module 220 (or the key control circuit 240) as an analog signal SA, and perform conversion to the analog signal SA by the conversion circuit having the calibration mechanism 260, so as to generate the second result DRS2. Next, in the second scan stage illustrated in step S940, the press status of the at least one key among the keys 601-625 may be re-determined by the processor 280 according to the second result DRS2. Lastly, in step S950, after the press status the at least one key among the keys 601-625 is re-determined, the switch signal SS may be generated by the processor 280, so that the switch circuit 2601 is switched back to select the first sensing signal SC1 from the first circuit 50 as the analog signal SA. The conversion may be performed to the analog signal SA by the conversion circuit having the calibration mechanism 260, so as to generate the first result DRS1. The system function corresponding to the first sensing signal SC1 may be executed by the processor 280 according to the first result DRS1. At this time, the scanning of the keys 601-625 is completed, and the process is returned back to the step S900 for next key detection operation.

In summary, in the exemplary electronic apparatus and the method for detecting key status presented above, conversion circuit having calibration mechanism, which is utilized to execute other system function (e.g., temperature control function or power monitor function, etc.), may be dynamically switched to assist the scanning function of the key module (i.e., the scanning function of the second scan stage). Since the first sensing signal which the conversion circuit having calibration mechanism is to convert originally would not have enormous instantaneous changes, the conversion circuit having calibration mechanism may be dynamically and temporarily switched to assist the scanning function of the key module without greatly effect the original system function. As a result, the key control circuit does not require calibration mechanism which reduces the cost of the circuit. In addition, since the conversion circuit having calibration mechanism is only utilized to assist the re-scan of the keys that are being determined as not pressed, the number of times and the time taken to re-scan are reduced. Therefore, the exemplary electronic apparatus of the disclosure may accurately determine the press status of the keys, it may also enhance the usage of the circuit resources.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic apparatus, comprising:
a key module, comprising a plurality of keys, at least one first line and at least one second line, wherein the at least one first line and the at least one second line are coupled to the keys to drive the keys or sense the keys;
a key control circuit, coupled to the at least one first line and the at least one second line, wherein the key control circuit detects whether any one of the keys is pressed, if a detection result is affirmative, the key control circuit scans a press status of each of the keys, and accordingly, obtains a coarse scan result;
a conversion circuit having calibration mechanism, comprising a switch circuit, wherein the switch circuit is coupled to a first circuit to receive a first sensing signal, coupled to the key control circuit to receive at least one second sensing signal on the at least one second line through the key control circuit, and controlled by a switch signal to pre-select the first sensing signal as an analog signal, wherein the conversion circuit having the calibration mechanism performs a conversion on the analog signal to generate a first result; and
a processor, coupled to the key control circuit and the conversion circuit having the calibration mechanism, wherein the processor executes a system function corresponding to the first sensing signal according to the first result,
wherein, when the processor determines that at least one of the keys is not pressed according to the coarse scan result, the processor generates the switch signal to cause the switch circuit to select one of the at least one second sensing signal as the analog signal, so that the conversion circuit having the calibration mechanism performs the conversion on the analog signal to generate a second result, and the processor re-determines the press status of the at least one of the keys according to the second result.

2. The electronic apparatus of claim 1, wherein, in a first scan stage, the key control circuit sequentially selects one of the at least one first line, and parallelly scans the press status of each of the keys on the selected first line through the at least one second line, so as to generate the coarse scan result.

3. The electronic apparatus of claim 2, wherein, in a detection stage, the key control circuit parallelly drives the at least one first line to an identical potential, and parallelly detects whether any one of the keys is pressed as a detection result through the at least one second line,
wherein, the key control circuit determines whether any one of the keys is pressed according to the detection result in the detection stage, if a determination result is affirmative, then the key control circuit enters into the first scan stage.

4. The electronic apparatus of claim 3, wherein the key control circuit comprising:
at least one comparator circuit, coupled to the at least one second line and the processor; and
a main control circuit, coupled to the at least one first line and the processor, wherein:
the main control circuit parallelly drives the at least one first line to a first potential in the detection stage, and the at least one comparator circuit compares a voltage of the at least one second line with a comparison voltage to generate the detection result; and
the main control circuit sequentially selects one of the at least one first line in the first scan stage, the main control circuit drives the selected one of the at least one first line to the first potential and drives other of the at least one first line to a second potential, and the at least one comparator circuit compares a voltage of the at least one second line with the comparison voltage to generate the coarse scan result.

5. The electronic apparatus of claim 2, wherein, in the first scan stage, when the processor determines that the at least one of the keys is not pressed according to the coarse scan result, the processor enters into a second scan stage, drives the first line corresponding to the key not pressed to a first potential and other of the at least one first line to a second potential through the key control circuit, the processor generates the switch signal to cause the switch circuit to select the second sensing signal of the second line corresponding to the key not pressed as the analog signal, so that the conversion circuit having the calibration mechanism performs the conversion to the analog signal to generate the second result, the processor compares the second result and a threshold value to re-determine the press status of the key not pressed.

6. The electronic apparatus of claim 1, wherein the conversion circuit having the calibration mechanism further comprises:
an analog-to-digital converter, coupled to the switch circuit to receive the analog signal, performing an analog-to-digital conversion to the analog signal to generate the first result or the second result, wherein the analog-to-digital converter has calibration mechanism.

7. The electronic apparatus of claim 1, wherein the first circuit comprises a temperature sensor or a power measurement circuit, and the processor executes a temperature control function or a power monitor function of the system function according to the first result.

8. A method for detecting a status of keys, configured for a key module of an electronic apparatus, the method comprising:
in a detection stage, detecting whether any one of a plurality of keys in the key module is pressed by a key control circuit of the electronic apparatus, if a detection result is affirmative, entering a first scan stage;
in the first scan stage, detecting a press status of each of the keys, by the key control circuit, and accordingly, obtaining a coarse scan result;
in the first scan stage, determining whether at least one of the keys is not pressed according to the coarse scan result by a processor of the electronic apparatus, if a determination result indicating that at least one of the keys is not pressed, entering into a second scan stage;
in the second scan stage, generating a switch signal by the processor, causing a switch circuit in a conversion circuit having calibration mechanism of the electronic apparatus to be switched to select corresponding one of at least one second sensing signal from the key module as an analog signal, and performing a conversion to the analog signal by the conversion circuit having calibration mechanism, so as to generate a second result;
in the second scan stage, re-determining the press status of the at least one of the keys according to the second result;
after the re-determination of the press status of the at least one of the keys is completed, generating the switch signal by the processor, so as to cause the switch circuit to be switched back to select a first sensing signal from a first circuit as the analog signal, performing the conversion to the analog signal to generate a first result by the conversion circuit having the calibration mechanism, and executing a system function corresponding to the first sensing signal according to the first result by the processor.

9. The method of claim 8, wherein, in the detection stage, the step of detecting whether any one of a plurality of keys in the key module is pressed by a key control circuit of the electronic apparatus comprises:
parallelly driving at least one first line of the key module to an identical potential by the key control circuit, and parallelly detecting whether any one of the keys is pressed as a detection result through at least one second line of the key module; and
determining whether any one of the keys is pressed according to the detection result by the key control circuit.

10. The method of claim 8, wherein in the first scan stage, the step of detecting a press status of each of the keys, by the key control circuit, and accordingly, obtaining a coarse scan result comprises:
sequentially selecting one of at least one first line of the key module according to the detection result by the key control circuit; and
parallelly scanning the press status of each key of the selected first line by the key control circuit and at least one second line of the key module, so as to generate the coarse scan result, wherein at least one key corresponding to the selected first line is pressed.

11. The method of claim 8, wherein in the first scan stage, the step of detecting a press status of each of the keys, by the key control circuit, and accordingly, obtaining a coarse scan result comprises:
sequentially selecting one of at least one first line of the key module by the key control circuit; and
parallelly scanning the press status of each key of the selected first line by the key control circuit and at least one second line of the key module, so as to generate the coarse scan result.

12. The method of claim 8, wherein, in the second scan stage, the step of generating a switch signal by the processor, causing a switch circuit in the a conversion circuit having calibration mechanism to be switched to select corresponding one of at least one second sensing signal from the key module as an analog signal, and performing a conversion to the analog signal by the conversion circuit having calibration mechanism, so as to generate a second result comprises:
driving a first line corresponding to the key not being pressed in the key module to a first potential by the key control circuit, and driving other first line of the key module to a second potential;
generating the switch signal by the processor, so as to cause the switch circuit to be switched and select the corresponding second sensing signal as the analog signal, wherein the corresponding second sensing signal corresponds to a second line of the key not being pressed in the key module; and
performing an analog-to-digital conversion to the analog signal to generate the second result by an analog-to-digital converter in the conversion circuit having calibration mechanism,
wherein the analog-to-digital converter has calibration mechanism.

13. The method of claim 8, wherein, in the second scan stage, the step of re-determining the press status of the at least one of the keys according to the second result comprises:
comparing the second result and a threshold value to re-determine the press status of the at least one of the keys by the processor.

14. The method of claim 8, wherein the system function comprises a temperature control function or a power monitor function.

* * * * *